US012812980B2

(12) United States Patent
Jiang et al.

(10) Patent No.: US 12,812,980 B2
(45) Date of Patent: Nov. 24, 2026

(54) ELECTRO-STATIC DISCHARGE DEVICE BASED ON PNPN STRUCTURE

(71) Applicant: CANSEMI TECHNOLOGY INC., Guangzhou (CN)

(72) Inventors: Dezhou Jiang, Guangzhou (CN); Bin Zhao, Guangzhou (CN)

(73) Assignee: CANSEMI TECHNOLOGY INC., Guangzhou (CN)

( * ) Notice: Subject to any disclaimer, the term of this patent is extended or adjusted under 35 U.S.C. 154(b) by 0 days.

(21) Appl. No.: 19/114,948

(22) PCT Filed: Dec. 17, 2024

(86) PCT No.: PCT/CN2024/140066
§ 371 (c)(1),
(2) Date: Mar. 25, 2025

(87) PCT Pub. No.: WO2026/036605
PCT Pub. Date: Feb. 19, 2026

(65) Prior Publication Data

US 2026/0052779 A1 Feb. 19, 2026

(30) Foreign Application Priority Data

Aug. 15, 2024 (CN) .......................... 202411118593.1

(51) Int. Cl.
*H10D 89/60* (2025.01)

(52) U.S. Cl.
CPC ................................ *H10D 89/713* (2025.01)

(58) Field of Classification Search
CPC .. H10D 89/611; H10D 89/713; H10D 89/813; H10D 89/911; H10D 89/921;
(Continued)

(56) References Cited

U.S. PATENT DOCUMENTS

| | | | | |
|---|---|---|---|---|
| 6,410,963 | B1 | 6/2002 | Lai et al. | |
| 10,504,886 | B1 * | 12/2019 | Yam .................... | H10D 62/129 |

(Continued)

FOREIGN PATENT DOCUMENTS

| | | | |
|---|---|---|---|
| CN | 101257005 | A | 9/2008 |
| CN | 102034811 | A | 4/2011 |

(Continued)

OTHER PUBLICATIONS

China National Intellectual Property Search Report. Sep. 23, 2024, 4 pages.

(Continued)

*Primary Examiner* — Leonard Chang
*Assistant Examiner* — Nimarta Kaur Chowdhary
(74) *Attorney, Agent, or Firm* — Gunther J. Evanina; BUTZEL LONG

(57) ABSTRACT

Disclosed is an electro-static discharge device based on a PNPN structure. First intersection boundary is formed between first P-well and N-well; second intersection boundary is formed between N-well and second P-well; first ion injection region is arranged on surface region of first P-well; second ion injection region is arranged on surface region of second P-well; first N-ion boundary injection region is arranged at position of first intersection boundary formed by the intersection of surface region of first P-well and surface region of N-well; second N-ion boundary injection region is arranged at position of second intersection boundary formed by intersection of surface region of N-well and surface region of second P-well; and parasitic discharge circuit spans first P-well, N-well, and second P-well, and parasitic discharge circuits is connected to first ion injection region and second ion injection region respectively.

7 Claims, 1 Drawing Sheet

(58) Field of Classification Search
CPC .......... H10D 8/80; H10D 62/10; H10D 18/80; H02H 9/04; H02H 9/005
See application file for complete search history.

(56) References Cited

U.S. PATENT DOCUMENTS

| | | | | |
|---|---|---|---|---|
| 12,125,843 | B2 * | 10/2024 | Xu | H10D 89/921 |
| 2013/0307020 | A1 | 11/2013 | Reinprecht | |
| 2019/0371786 | A1 * | 12/2019 | ChenHsu | H10D 89/611 |
| 2023/0017089 | A1 * | 1/2023 | Xu | H10D 8/80 |

FOREIGN PATENT DOCUMENTS

| | | | | | |
|---|---|---|---|---|---|
| CN | 105810679 | A | | 7/2016 | |
| CN | 109037208 | A | | 12/2018 | |
| CN | 110047921 | A | * | 7/2019 | H10W 42/60 |
| CN | 212485326 | U | | 2/2021 | |
| CN | 113540075 | A | | 10/2021 | |
| CN | 114883381 | A | | 8/2022 | |
| CN | 115966567 | A | * | 4/2023 | H10D 89/713 |
| CN | 116013924 | A | * | 4/2023 | H10D 89/713 |
| CN | 118645506 | A | | 9/2024 | |
| JP | 2010040839 | A | | 2/2010 | |

OTHER PUBLICATIONS

Machine Translation of JP2010040839A, Feb. 18, 2010, 13 pages.
Machine Translation of CN212485326U, Feb. 5, 2021, 12 pages.
Machine Translation of CN114883381A, Aug. 9, 2022, 15 pages.
Machine Translation of CN113540075A, Oct. 22, 2021, 10 pages.
Machine Translation of CN109037208A, Dec. 18, 2018, 12 pages.
Machine Translation of CN105810679A, Jul. 27, 2016, 8 pages.
Chinese Notice of Allowance (including English translation) issued in App. No. CN202411118593 dated Sep. 23, 2024 (pp. 1-8).
International Search Report and Written Opinion (including English translation) issued in App. No. PCT/CN2024/140066 dated Apr. 16, 2025 (pp. 1-12).

* cited by examiner

ELECTRO-STATIC DISCHARGE DEVICE BASED ON PNPN STRUCTURE

CROSS-REFERENCE TO RELATED APPLICATION

The present disclosure claims priority to Chinese patent application No. 202411118593.1, filed with the Chinese Patent Office on Aug. 15, 2024, entitled "ELECTRO-STATIC DISCHARGE DEVICE BASED ON PNPN STRUCTURE", the entire contents of which are incorporated herein by reference.

TECHNICAL FIELD

The present disclosure relates to the technical field of ESD charge discharge, and in particular to an electro-static discharge device based on a PNPN structure.

BACKGROUND ART

The traditional CMOS process ESD discharge devices mainly include the metal-oxide-semiconductor field-effect transistor (referred to as MOS), diode, resistor, capacitor, and other devices. Based on these devices, some ESD units, such as the gate ground NMOS (referred to as GGNMOS) unit and power clamp, can be further combined. These ESD units can realize the purpose of discharge by utilizing the parasitic effect of devices.

One of the ESD research directions is to improve ESD performance by utilizing the parasitic PNPN structure in the CMOS process, which not only eliminates the need to adjust any process steps and process parameters but also provides low cost and good effects. When the ESD charge strikes, the traditional method is to discharge the ESD charge by utilizing the parasitic PNPN structure in the CMOS process. However, since the snapback voltage of the ESD device is too high, the functional device has been damaged by thermal breakdown before the ESD charge is fully discharged and the ESD device is activated, thereby reducing the ESD charge discharge ability, which cannot improve the ESD protection ability.

SUMMARY

In view of this, an objective of the present disclosure is to provide at least an electro-static discharge device based on the PNPN structure, which reduces the snapback voltage by a high concentration boundary, so as to improve the ESD performance.

The present disclosure mainly includes the following aspects.

In a first aspect, an optional embodiment of the present disclosure provides an electro-static discharge device based on the PNPN structure, and the electro-static discharge device includes a P-type substrate, a first P-well, an N-well, a second P-well, a first ion injection region, a first N-ion boundary injection region, a second N-ion boundary injection region, a second ion injection region, and a parasitic discharge circuit, wherein the first P-well, the N-well, and the second P-well are arranged sequentially on a surface region of the P-type substrate from left to right; a first intersection boundary is formed between the first P-well and the N-well; a second intersection boundary is formed between the N-well and the second P-well; the first ion injection region is arranged on a surface region of the first P-well; the second ion injection region is arranged on the surface region of the second P-well; the first N-ion boundary injection region is arranged at a position of a first intersection boundary formed by an intersection of the surface region of the first P-well and a surface region of the N-well; the second N-ion boundary injection region is arranged at a position of a second intersection boundary formed by an intersection of the surface region of the N-well and the surface region of the second P-well; and a parasitic discharge circuit spans the first P-well, the N-well, and the second P-well, and the parasitic discharge circuits is connected to the first ion injection region and the second ion injection region respectively.

In an optional embodiment, the electro-static discharge device further includes a third ion injection region, and the third ion injection region is arranged on the surface region of the N-well.

In an optional embodiment, a third intersection boundary is formed on surfaces of the N-well and the P-type substrate, and the parasitic discharge circuit includes a first parasitic discharge module, a second parasitic discharge module, and a third parasitic discharge module, wherein the first parasitic discharge module is arranged in a region where the P-type substrate and the first P-well are located, and the first parasitic discharge module is connected to the first ion injection region, the first intersection boundary, and the third intersection boundary respectively; the second parasitic discharge module is arranged in a region where the P-type substrate and the second P-well are located, and the second ion injection region is connected to the second intersection boundary, the second intersection boundary, and the third intersection boundary respectively; and the second parasitic discharge module is further connected to the first parasitic discharge module; and the third parasitic discharge module is arranged in a region where the N-well is located, and the third parasitic discharge module is connected to the third ion injection region, the first intersection boundary, the second intersection boundary, and the third intersection boundary respectively.

In an optional embodiment, the first parasitic discharge module includes a first parasitic resistor and a first parasitic triode, wherein a base electrode of the first parasitic triode, an emitter of the first parasitic triode, and one end of the first parasitic resistor are connected to the first ion injection region respectively; a collector of the first parasitic triode is connected to the first intersection boundary; the other end of the first parasitic resistor is connected to the third intersection boundary and the second parasitic discharge module; and the first parasitic triode is arranged in a region where the first P-well is located, and the first parasitic resistor is arranged in a region where the P-type substrate is located.

In an optional embodiment, the first ion injection region includes a first N-ion injection region and a first P-ion injection region arranged sequentially from left to right, wherein the first N-ion injection region is connected to the emitter of the first parasitic triode and the one end of the first parasitic resistor respectively, and the first P-ion injection region is connected to the base electrode of the first parasitic triode.

In an optional embodiment, the second parasitic discharge module includes a second parasitic resistor and a second parasitic triode, wherein a base electrode of the second parasitic triode, an emitter of the second parasitic triode, and one end of the second parasitic resistor are connected to the second ion injection region respectively; a collector of the second parasitic triode is connected to the second intersection boundary; the other end of the second parasitic resistor is connected to the third intersection boundary and the first parasitic discharge module; and the second parasitic triode is arranged in a region where the second P-well is located, and the second parasitic resistor is arranged in a region where the P-type substrate is located.

In an optional embodiment, the second ion injection region includes a second P-ion injection region and a second N-ion injection region arranged sequentially from left to right, wherein the second N-ion injection region is connected to the emitter of the second parasitic triode and the one end of the second parasitic resistor respectively, and the second P-ion injection region is connected to the base electrode of the second parasitic triode.

In an optional embodiment, the third parasitic discharge module includes a third parasitic resistor, a third parasitic triode, and a fourth parasitic triode, wherein one end of the third parasitic resistor, an emitter of the third parasitic triode, and an emitter of the fourth parasitic triode are connected to the third ion injection region respectively; the other end of the third parasitic resistor is connected to a base electrode of the third parasitic triode, a base electrode of the fourth parasitic triode, the first intersection boundary, and the second intersection boundary respectively, and a collector of the third parasitic triode and a collector of the fourth parasitic triode are connected to the third intersection boundary respectively; and the third parasitic resistor, the third parasitic triode, and the fourth parasitic triode are arranged in the region where the N-well is located.

In an optional embodiment, the third ion injection region includes a third P-ion injection region, a third N-ion injection region, and a fourth P-ion injection region arranged sequentially from left to right, wherein the third P-ion injection region is connected to the emitter of the third parasitic triode; the third N-ion injection region is connected to the one end of the third parasitic resistor; and the fourth P-ion injection region is connected to the emitter of the fourth parasitic triode.

In an optional embodiment, ion concentrations in the first intersection boundary, the second intersection boundary, and the third intersection boundary are obtained by doping the N ions injected from the first N-ion boundary injection region and the second N-ion boundary injection region with ions in the N-well region.

The embodiments of the present disclosure provide an electro-static discharge device based on the PNPN structure. The first P-well, the N-well, and the second P-well are arranged sequentially on the surface region of the P-type substrate from left to right; the first intersection boundary is formed between the first P-well and the N-well; the second intersection boundary is formed between the N-well and the second P-well; the first ion injection region is arranged on the surface region of the first P-well; the second ion injection region is arranged on the surface region of the second P-well; the first N-ion boundary injection region is arranged at a position of the first intersection boundary formed by the intersection of the surface region of the first P-well and the surface region of the N-well; the second N-ion boundary injection region is arranged at a position of the second intersection boundary formed by the intersection of the surface region of the N-well and the surface region of the second P-well; and the parasitic discharge circuit spans the first P-well, the N-well, and the second P-well, and the parasitic discharge circuits is connected to the first ion injection region and the second ion injection region respectively. The present disclosure reduces the snapback voltage by a high concentration boundary, so as to improve the ESD performance.

In order to make the above objectives, features, and advantages of the present disclosure more obvious and understandable, the following preferable embodiments, together with the drawings, are described in detail as follows.

BRIEF DESCRIPTION OF DRAWINGS

In order to more clearly illustrate the technical solutions in the embodiments of the present disclosure, the following will briefly introduce the drawings to be used in the embodiments. It is to be understood that the following drawings illustrate only certain embodiments of the present disclosure, and therefore should not be regarded as a limitation of the scope. For persons of ordinary skill in the field, other relevant drawings can be obtained according to these drawings without inventive efforts.

DETAILED DESCRIPTION OF EMBODIMENTS

Figure 1:
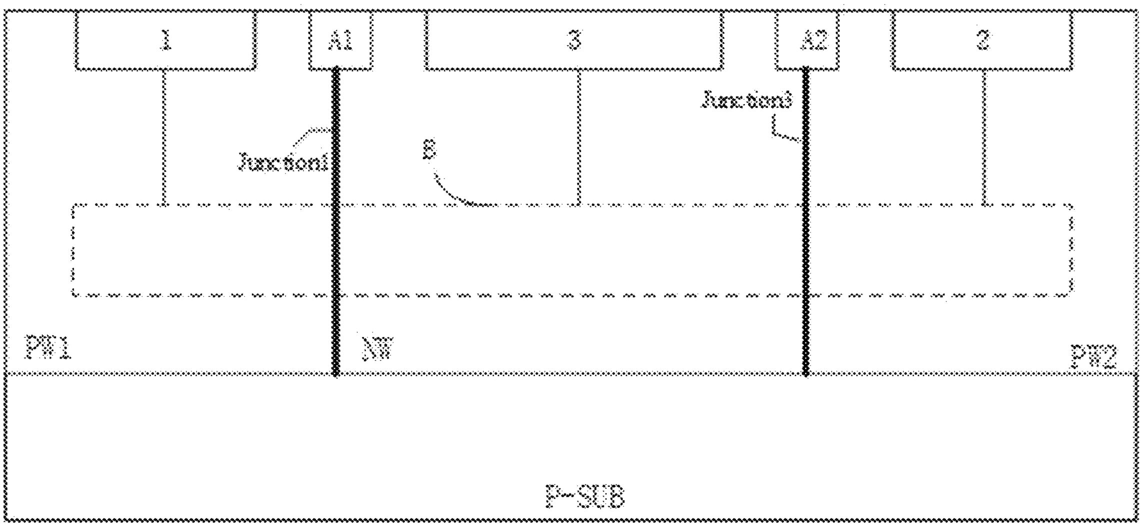
FIG. 1 shows one schematic structure diagram of an electro-static discharge device of a PNPN structure provided in an optional embodiment of the present disclosure.

In order to make the objectives, technical solutions, and advantages of the embodiments of the present disclosure clearer, the technical solutions in the embodiments of the present disclosure will be clearly and completely described in conjunction with the drawings in the embodiments of the present disclosure. It should be understood that the drawings in the present disclosure are used for illustrative and descriptive purposes only, and are not intended to limit the scope of protection of the present disclosure. Furthermore, it should be understood that the schematic drawings are not drawn to physical scale. The flow diagrams used in the present disclosure show operations realized according to some embodiments of the present disclosure. It should be understood that the operations of the flow diagram may be realized out of order, and the steps without logical context can be reversed or realized simultaneously. Additionally, a person skilled in the art, under the guidance of the present disclosure, can add one or more other operations to the flow diagrams or remove one or more operations from the flow diagrams.

Further, the embodiments described are merely partial embodiments of the present disclosure, but not all of the embodiments. The components in the embodiments of the present disclosure generally described and shown in the drawings herein can be arranged and designed in multiple different configurations. Therefore, the following detailed description of embodiments of the present disclosure provided in the drawings is not intended to limit the scope of the present disclosure for which protection is claimed, but rather represents only selected embodiments of the present disclosure. Based on the embodiments of the present disclosure, all other embodiments obtained by a person skilled in the art without inventive efforts shall fall within the scope of protection of the present disclosure.

The traditional method is to discharge the ESD charge by utilizing the parasitic PNPN structure in the CMOS process. However, since the snapback voltage of the ESD device is too high, the functional device has been damaged by thermal breakdown before the ESD charge is fully discharged and the ESD device is activated, thereby reducing the ESD charge discharge ability, which cannot improve the ESD protection ability.

Based on this, the embodiments of the present disclosure provide an electro-static discharge device based on the PNPN structure, which reduces the snapback voltage by the high concentration boundary, so as to improve the ESD performance. The details are as follows.

Referring to FIG. 1, FIG. 1 shows one schematic structure diagram of an electro-static discharge device of a PNPN structure provided in an optional embodiment of the present disclosure. As shown in FIG. 1, the electro-static discharge device provided by the embodiment of the present disclosure includes a P-type substrate P-SUB, a first P-well PW1, an N-well NW, a second P-well PW2, a first ion injection region 1, a second ion injection region 2, a third ion injection region 3, a first N-ion boundary injection region A1, a second N-ion boundary injection region A2, and a parasitic discharge circuit B.

In an optional embodiment, the first P-well PW1, the N-well NW, and the second P-well PW2 are arranged sequentially on a surface region of the P-type substrate P-SUB from left to right, wherein a first intersection boundary Junction 1 is formed between the first P-well PW1 and the N-well NW, and a second intersection boundary Junction2 is formed between the N-well NW and the second P-well PW 2. Specifically, the first P-well PW1 transitions to the N-well NW by the first intersection boundary Junction 1, and the N-well NW transitions to the second P-well PW2 through the second intersection boundary Junction2.

The first ion injection region 1 is arranged on a surface region of the first P-well PW1; the second ion injection region 2 is arranged on a surface region of the second P-well PW2; the third ion injection region 3 is arranged on a surface region of the N-well NW. The first N-ion boundary injection region A1 is arranged at a position of the first intersection boundary Junction 1 formed by the intersection of the surface region of the first P-well PW1 and the surface region of the N-well NW, and the second N-ion boundary injection region A2 is arranged at a position of the second intersection boundary Junction2 formed by the intersection of the surface region of the N-well NW and the surface region of the second P-well PW2.

The parasitic discharge circuit B spans the first P-well PW1, the N-well NW, and the second P-well PW2, and the parasitic discharge circuit is connected to the first ion injection region 1 and the second ion injection region 2 respectively.

Figure 2:
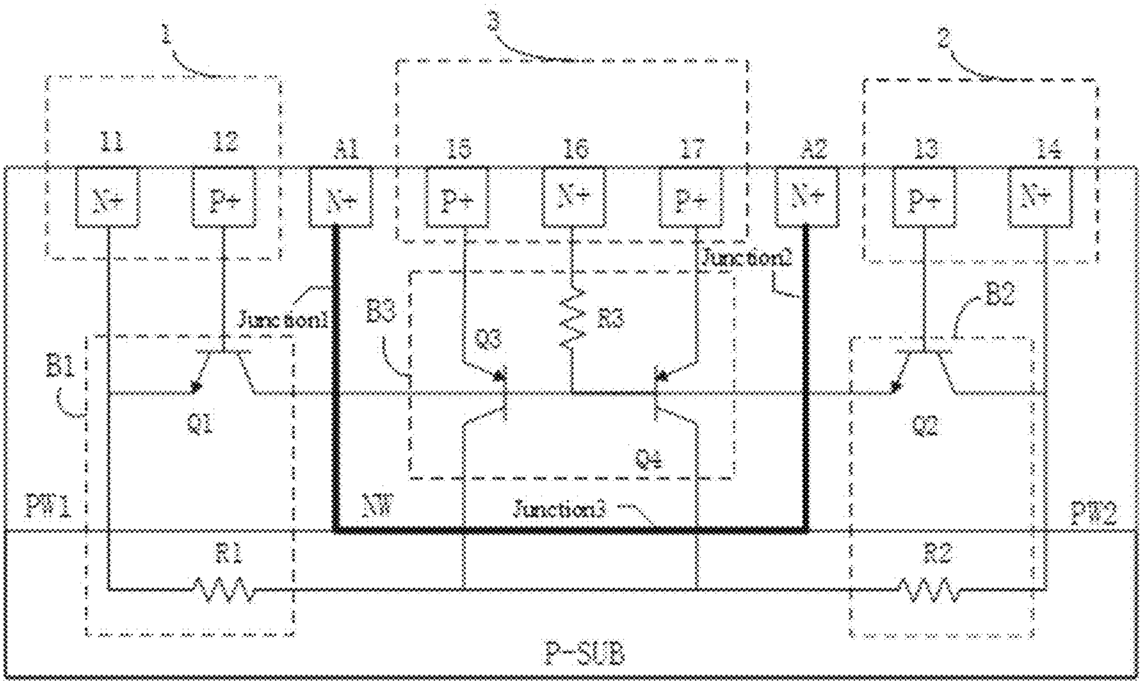
FIG. 2 shows another schematic structure diagram of an electro-static discharge device of a PNPN structure provided in an optional embodiment of the present disclosure.

Referring to FIG. 2, FIG. 2 shows the other schematic structure diagram of an electro-static discharge device of the PNPN structure provided in an optional embodiment of the present disclosure. As shown in FIG. 2, a third intersection boundary Junction3 is formed on surfaces of the N-well NW and the P-type substrate P-USB, and the parasitic discharge circuit B includes a first parasitic discharge module B1, a second parasitic discharge module B2, and a third parasitic discharge module B3.

In an optional embodiment, the first parasitic discharge module B1 is arranged in a region where the P-type substrate P-SUB and the first P-well PW1 are located, and the first parasitic discharge module B1 is connected to the first ion injection region 1, the first intersection boundary Junction 1, and the third intersection boundary Junction3 respectively.

The second parasitic discharge module B2 is arranged in a region where the P-type substrate P-SUB and the second P-well PW2 are located. The second ion injection region B2 is connected to the second intersection boundary 2, the second intersection boundary Junction2, and the third intersection boundary Junction3 respectively, and the second parasitic discharge module B2 is further connected to the first parasitic discharge module B1.

The third parasitic discharge module B3 is arranged in a region where the N-well NW is located, and the third parasitic discharge module B3 is connected to the third ion injection region 3, the first intersection boundary Junction 1, the second intersection boundary Junction2, and the third intersection boundary Junction3 respectively.

In an optional embodiment, the first parasitic discharge module B1 includes a first parasitic resistor R1 and a first parasitic triode Q1; the second parasitic discharge module B2 includes a second parasitic resistor R2 and a second parasitic triode Q2; and the third parasitic discharge module B3 includes a third parasitic resistor R3, a third parasitic triode Q3, and a fourth parasitic triode Q4, wherein the first ion injection region 1 includes a first N-ion injection region 11 and a first P-ion injection region 12 arranged sequentially from left to right; the second ion injection region 2 includes a second P-ion injection region 13 and a second N-ion injection region 14 arranged sequentially from left to right; and the third ion injection region 3 includes a third P-ion injection region 15, a third N-ion injection region 16, and a fourth P-ion injection region 17 arranged in sequentially from left to right.

In an optional embodiment, a base electrode of the first parasitic triode Q1 is connected to the first P-ion injection region 12; an emitter of the first parasitic triode Q1 and one end of the first parasitic resistor R1 are connected to the first N-ion injection region 11 respectively; a collector of the first parasitic triode Q1 is connected to the first intersection boundary Junction 1; and the other end of the first parasitic resistor R1 is connected to the third intersection boundary Junction3 and the other end of the second parasitic resistor R2.

The first parasitic triode Q1 is arranged in a region where the first P-well PW1 is located, and the first parasitic resistor R1 is arranged in a region where the P-type substrate P-SUB is located, wherein both the first parasitic triode Q1 and the second parasitic triode Q2 are NPN triodes.

The base electrode of the second P-ion injection region Q2 is connected to the second parasitic triode 13; an emitter of the second parasitic triode Q2 and one end of the second parasitic resistor R2 are connected to the second N-ion injection region 14 respectively; a collector of the second parasitic triode Q2 is connected to the second intersection boundary Junction2; and the other end of the second parasitic resistor R2 is connected to the third intersection boundary Junction3 and the other end of the first parasitic resistor R1.

The second parasitic triode Q2 is arranged in a region where the second P-well PW2 is located, and the second parasitic resistor R2 is arranged in a region where the P-type substrate P-SUB is located.

One end of the third parasitic resistor R3 is connected to the third N-ion injection region 16; an emitter of the third parasitic triode Q3 is connected to the third P-ion injection region 15; and an emitter of the fourth parasitic triode Q4 is connected to the fourth P-ion injection region.

The other end of the third parasitic resistor R3 is connected to a base electrode of the third parasitic triode Q3, a base electrode of the fourth parasitic triode Q4, the first intersection boundary Junction 1, and the second intersection boundary Junction2 respectively, and a collector of the third parasitic triode Q3 and a collector of the fourth parasitic triode Q4 are connected to the third intersection boundary Junction3 respectively.

The third parasitic resistor R3, the third parasitic triode Q3, and the fourth parasitic triode Q4 are arranged in the region where the N-well NW is located, wherein the third parasitic triode Q3 and the fourth parasitic triode Q4 are PNP triodes.

In the present disclosure, the collector of the first parasitic triode Q1 is connected to the base electrode of the third parasitic triode Q3 by the transition action of the first intersection boundary Junction 1 and the collector of the second parasitic triode Q2 is connected to the base electrode of the fourth parasitic triode Q4 by the transition action of the second intersection boundary Junction2.

In an optional embodiment, the ion concentrations in the first intersection boundary, the second intersection boundary, and the third intersection boundary are obtained by doping the N ions injected from the first N-ion boundary injection region and the second N-ion boundary injection region with ions in the N-well region. Specifically, the doping concentration of the N+ ions injected from the first N-ion boundary injection region A1 and the second N-ion boundary injection region A2 is different from that of the ions in the N-well NW in the process. In the process, the reverse breakdown voltage and the concentration are closely related, wherein the reverse breakdown voltage with a higher concentration is lower than that with a lower concentration. Based on this principle and the actual demand, in the present disclosure, the first N-ion boundary injection region A1 and the second N-ion boundary injection region are parallelly incorporated with high-concentration doped N+, PW, and NW intersection boundaries, which can reduce the reverse breakdown voltage, so as to meet the actual demand.

In an optional embodiment, the first N-ion injection region 11, the first P-ion injection region 12, the third P-ion injection region 15, the third N-ion injection region 16, and the fourth P-ion injection region 17 are respectively connected to the VDD end (the working voltage end inside the device), and the second P-ion injection region 13 and the second N-ion injection region 14 are respectively connected to the VSS end (the ground end inside the device).

In the present disclosure, it is assumed that β1 is the amplification of the third parasitic triode Q3 and the fourth parasitic triode Q4; β2 is the amplification of the first parasitic triode Q1 and the second parasitic triode Q2; and Ib2 is the reverse leakage current corresponding to the N-well NW, the first P-well PW1, and the second P-well PW2.

In the electro-static discharge device provided in FIG. 2, when the ESD charge strikes, the first intersection boundary Junction 1 and the second intersection boundary Junction2 withstand the incoming ESD charges. Before the reverse breakdown current leakage Ib2 at the intersection boundary between the P-well and the N-well provided in the solution of the traditional electro-static discharge device begins, the reverse breakdown current leakage Ib2 at the first intersection boundary Junction 1 and the second intersection boundary Junction2 provided in the present disclosure already starts. Since the first parasitic resistor R1 is the end resistor between the base electrode and the emitter of the first parasitic triode Q1, and the second parasitic resistor R2 is the end resistor between the base electrode and the emitter of the second parasitic triode Q2, according to Ohm law, it is known that the end voltage between the base electrode and emitter of the first parasitic triode Q1 is Vbe2 (B1)=Ib2×R1, and the end voltage between the base electrode and emitter of the second parasitic triode Q2 is Vbe2 (B2)=Ib2×R2.

When the voltage drops on Vbe2 (B1) or Vbe2 (B2) is larger than 0.7v, the emitter of the first parasitic triode Q1 or the second parasitic triode Q2 is forward-biased, and the collector is reverse-biased. The first parasitic triode Q1 or the second parasitic triode Q2 is in the amplification region of the triode, and the current flowing through the first parasitic triode Q1 or the second parasitic triode Q2 is Ic2=β2×Ib2. Since the Ic2 current will pass through the third parasitic resistor R3, the third parasitic resistor R3 is also an end resistor between the base electrode and the emitter of the third parasitic triode Q3 or the fourth parasitic triode Q4, so that the end voltage between the base electrode and the emitter of the third parasitic triode Q3 or the end voltage between the base electrode and the emitter of the fourth parasitic triode Q4 can also be obtained as Vbe1=Ic2×R3, which, converted to the Ib2, it becomes Vbe1=β2×Ib2×R1. Meanwhile, the emitters of the third parasitic triode Q3 and the fourth parasitic triode Q4 are forward-biased, and the collectors are reverse-biased. The third parasitic triode Q3 and the fourth parasitic triode Q4 are in the amplification region of the triode, where Ic1=β1×β2×Ib2. The cycle continues repeatedly until the ESD charge discharge is finished, thereby realizing the purpose of the protection of functional devices.

The difference between the present disclosure and the traditional solution provided by the related art is that a high concentration of intersection boundary is added in parallel between VDD~VSS, wherein the reverse breakdown voltage of this intersection boundary is significantly lower than the reverse breakdown voltage of the P-well and N-well. Since the reverse breakdown voltage (snapback voltage) between VDD~VSS is reduced, the electro-static discharge device can activate the relevant protection at a relatively low voltage, which is obviously helpful to the product application and the improvement of the ESD performance.

It is clearly understood by those skilled in the field that for the convenience and brevity of the description, the specific working process of the system and device described above can refer to the corresponding process in the above method embodiments, and will not be repeated herein. In the embodiments provided by the present disclosure, it should be understood that the disclosed system, device, and method may also be realized in other ways. The embodiments of the device described above are only illustrative, for example, the division of the units is only a logical functional division, and it can be divided in another way when actually realized, or for example, multiple units or components can be combined or can be integrated into another system, or some features can be ignored, or not be executed. Additionally, the mutual coupling or direct coupling, or communication connection shown or discussed can be an indirect coupling or communication connection via some communication interfaces, devices, or units, which can be electrical, mechanical, or other forms.

The unit illustrated as a separated component can or cannot be physically separated, and the components shown as a unit can or cannot be a physical unit, i.e., it can be located in a single place, or it can be distributed in a plurality of network units. Some or all of these units can be selected to fulfill the purpose of the solution of the embodiment according to actual needs.

Additionally, the various functional units in various embodiments of the present disclosure can be integrated to form one process unit; each unit may physically exist individually, or two or more units may be integrated into a single unit.

The function, if realized in the form of a software functional unit and sold or used as an individual product, it may be stored in a processor-executable, non-volatile, computer-readable storage medium. Based on this understanding, the technical solution of the present disclosure in essential, the part contributing to the related art, or the part of the technical solutions can be embodied in the form of the software product. The computer software product is stored in a storage medium, including several instructions to cause a computer device (which may be a personal computer, a server, or a network device, etc.) to perform all or part of the steps of the method described in each embodiment of the present disclosure. The foregoing storage medium includes: U disk, portable hard disk, Read-Only Memory (ROM), Random Access Memory (RAM), disk, disc, or other medium that can store the program code.

The foregoing are only the embodiments of the present disclosure, but the scope of protection of the present disclosure is not limited thereto. Any technical personnel familiar with the technical field can easily think of changes or replacements within the technical scope of the present disclosure, shall be covered by the scope of protection of the present disclosure. Therefore, the scope of protection of the present disclosure shall be governed by the scope of protection of the claims.

The invention claimed is:

1. An electro-static discharge device based on a PNPN structure comprising a P-type substrate, a first P-well, an N-well, a second P-well, a first ion injection region, a first N-ion boundary injection region, a second N-ion boundary injection region, a second ion injection region, and a parasitic discharge circuit, wherein the first P-well, the N-well, and the second P-well are arranged sequentially on a surface region of the P-type substrate from left to right; a first intersection boundary is formed between the first P-well and the N-well; a second intersection boundary is formed between the N-well and the second P-well;

the first ion injection region is arranged on a surface region of the first P-well; the second ion injection region is arranged on a surface region of the second P-well; the first N-ion boundary injection region is arranged at a position of the first intersection boundary formed by an intersection of the surface region of the first P-well and a surface region of the N-well; and the second N-ion boundary injection region is arranged at a position of the second intersection boundary formed by an intersection of the surface region of the N-well and the surface region of the second P-well;

the parasitic discharge circuit spans the first P-well, the N-well, and the second P-well, and the parasitic discharge circuit is connected to the first ion injection region and the second ion injection region;

the electro-static discharge device further comprises a third ion injection region, and the third ion injection region is arranged on the surface region of the N-well;

a third intersection boundary is formed on surfaces of the N-well and the P-type substrate, and the parasitic discharge circuit comprises a first parasitic discharge module, a second parasitic discharge module, and a third parasitic discharge module, wherein the first parasitic discharge module is arranged in a region where the P-type substrate and the first P-well are located, and the first parasitic discharge module is connected to the first ion injection region, the first intersection boundary, and the third intersection boundary;

the second parasitic discharge module is arranged in a region where the P-type substrate and the second P-well are located, wherein the second parasitic discharge module is connected to the second ion injection region, the second intersection boundary, and the third intersection boundary, and the second parasitic discharge module is further connected to the first parasitic discharge module;

the third parasitic discharge module is arranged in a region where the N-well is located, and the third parasitic discharge module is connected to the third ion injection region, the first intersection boundary, the second intersection boundary, and the third intersection boundary; and ion concentrations in the first intersection boundary, the second intersection boundary, and the third intersection boundary are obtained by doping N ions injected from the first N-ion boundary injection region and the second N-ion boundary injection region with ions in the N-well region.

2. The electro-static discharge device according to claim 1, wherein the first parasitic discharge module comprises a first parasitic resistor and a first parasitic triode, wherein a base electrode of the first parasitic triode, an emitter of the first parasitic triode, and one end of the first parasitic resistor are connected to the first ion injection region; a collector of the first parasitic triode is connected to the first intersection boundary; another end of the first parasitic resistor is connected to the third intersection boundary and the second parasitic discharge module; and the first parasitic triode is arranged in a region where the first P-well is located, and the first parasitic resistor is arranged in a region where the P-type substrate is located.

3. The electro-static discharge device according to claim 2, wherein the first ion injection region comprises a first N-ion injection region and a first P-ion injection region arranged sequentially from left to right; and the first N-ion injection region is connected to the emitter of the first parasitic triode and the one end of the first parasitic resistor, and the first P-ion injection region is connected to the base electrode of the first parasitic triode.

4. The electro-static discharge device according to claim 1, wherein the second parasitic discharge module comprises a second parasitic resistor and a second parasitic triode, wherein a base electrode of the second parasitic triode, an emitter of the second parasitic triode, and one end of the second parasitic resistor are connected to the second ion injection region; a collector of the second parasitic triode is connected to the second intersection boundary; another end of the second parasitic resistor is connected to the third intersection boundary and the first parasitic discharge module; and the second parasitic triode is arranged in the region where the second P-well is located, and the second parasitic resistor is arranged in the region where the P-type substrate is located.

5. The electro-static discharge device according to claim 4, wherein the second ion injection region comprises a second P-ion injection region and a second N-ion injection region arranged sequentially from left to right; and the second N-ion injection region is connected to the emitter of the second parasitic triode and one end of the second parasitic resistor, and the second P-ion injection region is connected to the base electrode of the second parasitic triode.

6. The electro-static discharge device according to claim 1, wherein the third parasitic discharge module comprises a third parasitic resistor, a third parasitic triode, and a fourth parasitic triode, wherein one end of the third parasitic resistor, an emitter of the third parasitic triode, and an emitter of the fourth parasitic triode are connected to the third ion injection region;

another end of the third parasitic resistor is connected to a base electrode of the third parasitic triode, a base electrode of the fourth parasitic triode, the first intersection boundary, and the second intersection boundary, and a collector of the third parasitic triode and a collector of the fourth parasitic triode are connected to the third intersection boundary; and the third parasitic resistor, the third parasitic triode, and the fourth parasitic triode are arranged in the region where the N-well is located.

7. The electro-static discharge device according to claim 6, wherein the third ion injection region comprises a third P-ion injection region, a third N-ion injection region, and a fourth P-ion injection region arranged sequentially from left to right; and the third P-ion injection region is connected to the emitter of the third parasitic triode; the third N-ion injection region is connected to one end of the third parasitic resistor; and the fourth P-ion injection region is connected to the emitter of the fourth parasitic triode.

* * * * *